(12) United States Patent
Rodman

(10) Patent No.: US 7,185,305 B1
(45) Date of Patent: Feb. 27, 2007

(54) CREATING A POWER DISTRIBUTION ARRANGEMENT WITH TAPERED METAL WIRES FOR A PHYSICAL DESIGN

(75) Inventor: Paul Rodman, Palo Alto, CA (US)

(73) Assignee: Magma Design Automation, Inc., Santa Clara, CA (US)

( * ) Notice: Subject to any disclaimer, the term of this patent is extended or adjusted under 35 U.S.C. 154(b) by 144 days.

(21) Appl. No.: 10/855,539

(22) Filed: May 26, 2004

Related U.S. Application Data

(63) Continuation-in-part of application No. 09/714,722, filed on Nov. 15, 2000, now Pat. No. 6,857,116.

(51) Int. Cl.
*G06F 17/50* (2006.01)

(52) U.S. Cl. .......................................... 716/13; 716/10

(58) Field of Classification Search ................. 716/4, 716/5, 12, 13; 703/15; 257/211, 691, 775; 438/599
See application file for complete search history.

(56) References Cited

U.S. PATENT DOCUMENTS

| | | | |
|---|---|---|---|
| 5,309,371 A | | 5/1994 | Shikata et al. |
| 5,349,542 A | * | 9/1994 | Brasen et al. .................. 703/15 |
| 5,604,680 A | | 2/1997 | Bamji et al. |
| 5,737,580 A | * | 4/1998 | Hathaway et al. ............. 716/12 |
| 5,787,268 A | | 7/1998 | Sugiyama et al. |
| 6,080,204 A | | 6/2000 | Mendel |
| 6,111,310 A | * | 8/2000 | Schultz ....................... 257/691 |
| 6,173,435 B1 | | 1/2001 | Dupenloup |
| 6,272,668 B1 | | 8/2001 | Teene |
| 6,306,745 B1 | * | 10/2001 | Chen .......................... 438/599 |
| 6,308,303 B1 | * | 10/2001 | Mysore et al. ................. 716/5 |
| 6,408,427 B1 | * | 6/2002 | Cong et al. ................... 716/13 |
| 6,467,074 B1 | | 10/2002 | Katsioulas et al. |
| 6,476,497 B1 | * | 11/2002 | Waldron et al. ............ 257/775 |
| 6,479,845 B2 | * | 11/2002 | Chen .......................... 257/211 |
| 6,519,749 B1 | | 2/2003 | Chao et al. |
| 6,653,726 B1 | * | 11/2003 | Schultz et al. .............. 257/691 |
| 6,701,509 B2 | * | 3/2004 | Aggarwal et al. ............ 716/13 |
| 6,772,401 B2 | | 8/2004 | Li |
| 6,857,116 B1 | * | 2/2005 | Dahl et al. .................... 716/12 |
| 6,876,960 B1 | | 4/2005 | Naylor et al. |
| 2005/0097488 A1 | | 5/2005 | Lakshamanan et al. |

OTHER PUBLICATIONS

Silicon Ensemble PKS, Cadence Design Systems, 2003. http://www.cadence.com/datasheets/sepks_ds.pdf.*

* cited by examiner

*Primary Examiner*—Leigh M. Garbowski
(74) *Attorney, Agent, or Firm*—Fenwick & West LLP

(57) ABSTRACT

Methods of creating a power distribution arrangement with tapered metal wires for a physical design are provided and described. In one embodiment, a method of creating a power distribution arrangement for a physical design of an integrated circuit includes arranging a plurality of metal wires for power distribution in a desired arrangement. Each metal wire has a width. Furthermore, the metal wires are tapered such that the width is thicker in a core edge area of the physical design than in a core center area of the physical design. In other embodiments, a method of creating a power distribution arrangement for a physical design of a current integrated circuit includes arranging a plurality of metal wires for power distribution in a desired arrangement. The metal wires are tapered using a routing congestion profile and/or a voltage drop profile of a prior physical design of a prior integrated circuit.

57 Claims, 13 Drawing Sheets

400

| 75 | 60 | 75 | 60 | 75 | 95 | 60 | 75 | 60 | 95 | 60 | 75 | 60 |
|----|----|----|----|----|----|----|----|----|----|----|----|----|
| 60 | 60 | 60 | 60 | 60 | 60 | 60 | 60 | 60 | 60 | 60 | 60 | 60 |
| 60 | 75 | 60 | 95 | 95 | 95 | 60 | 60 | 60 | 90 | 90 | 60 | 75 |
| 75 | 60 | 60 | 95 | 95 | 95 | 60 | 60 | 75 | 90 | 90 | 60 | 60 |
| 60 | 60 | 60 | 95 | 95 | 95 | 60 | 75 | 60 | 90 | 90 | 60 | 95 |
| 60 | 60 | 60 | 60 | 60 | 60 | 60 | 60 | 60 | 75 | 60 | 60 | 60 |
| 75 | 60 | 60 | 60 | 60 | 60 | 75 | 60 | 75 | 60 | 60 | 60 | 75 |
| 60 | 60 | 60 | 60 | 75 | 60 | 60 | 60 | 60 | 60 | 75 | 60 | 60 |
| 60 | 60 | 95 | 60 | 60 | 60 | 60 | 75 | 60 | 60 | 60 | 60 | 60 |
| 95 | 75 | 60 | 60 | 60 | 60 | 60 | 80 | 80 | 80 | 80 | 75 | 95 |
| 60 | 60 | 60 | 60 | 60 | 60 | 75 | 80 | 80 | 80 | 80 | 60 | 60 |
| 95 | 60 | 60 | 75 | 60 | 60 | 60 | 80 | 80 | 80 | 80 | 60 | 75 |
| 75 | 60 | 60 | 60 | 60 | 95 | 60 | 80 | 80 | 80 | 80 | 75 | 60 |
| 60 | 60 | 60 | 60 | 60 | 60 | 75 | 60 | 60 | 75 | 60 | 60 | 60 |
| 75 | 95 | 75 | 95 | 75 | 60 | 60 | 95 | 60 | 60 | 60 | 60 | 95 |

Figure 4

500

CREATING A POWER DISTRIBUTION ARRANGEMENT WITH TAPERED METAL WIRES FOR A PHYSICAL DESIGN

CROSS REFERENCE TO RELATED APPLICATION

This patent application is a Continuation-in-Part of U.S. Ser. No. 09/714,722 now U.S. Pat. No. 6,857,116, filed on Nov. 15, 2000 issued on Feb. 15, 2005, entitled "OPTIMIZATION OF ABBUTED-PIN HIERARCHICAL PHYSICAL DESIGN", by Dahl et al., which is incorporated herein by reference.

BACKGROUND OF THE INVENTION

1. Field of the Invention

The present invention generally relates to generating a physical design for an integrated circuit chip. More particularly, the present invention relates to the field of method and system for creating a power distribution arrangement with tapered metal wires for a physical design.

2. Related Art

The process of generating a physical design for an integrated circuit chip is complicated. The physical design represents the layout of the integrated circuit chip on a semiconductor, such as silicon, and is utilized to fabricate the integrated circuit chip. There are several types of physical designs: flat physical designs and hierarchical physical designs. Typically, the physical design is generated in several stages. Examples of these stages include floorplanning, placement, routing, and verification. In a flat physical design, these stages are sequentially performed on the entire layout, while in a hierarchical physical design these stages are sequentially performed on partitions of the layout referred as blocks (or place-and-route blocks).

Floorplanning is performed before placement and routing. Thus, floorplanning affects subsequent stages such as placement and routing. The main goal and objective of floorplanning is creating a floorplan. The floorplan can determine whether placement and routing are possible for the physical design.

During the top-level floorplanning stage of a hierarchical physical design, blocks are arranged on a selected chip area and chip shape. In arranging the blocks, individual blocks are sized and shaped. These blocks can have any number of cells that execute digital or analog functions (e.g., NAND, NOR, D flip-flop, etc.) by convectively grouping circuit elements such as transistors, capacitors, resistors, and other circuit elements. Moreover, these blocks can have one or more macrocells. A macrocell is a functional module such as RAM, ROM, ALU, etc. Each of these cells and macrocells has one or more ports (or terminals) for inputting signals or outputting signals, each of which, in turn, may connect to one or more ports of other cells and macrocells via metal wires. A net is a set of two or more ports that are connected. Generally, the input to the floorplanning stage is a netlist for the integrated circuit chip. A netlist is a list of nets for the integrated circuit chip.

Continuing, the location of Input/Output blocks is determined. These Input/Output blocks facilitate connections/communication with external components. An Input/Output block may have bonding pad cells or bump cells. Moreover, power distribution and clock distribution are determined during the top-level floorplanning stage of the hierarchical physical design. Furthermore, the top-level floorplanning stage is performed with the objectives of minimizing the chip area and minimizing delay.

FIG. 1A illustrates a power distribution arrangement 100 for a physical design (flat or hierarchical) of the prior art. As shown in FIG. 1A, the power distribution arrangement 100 has a plurality of metal wires 10 and 20 arranged in a mesh shape. Moreover, the vertical metal wires 10 are formed using a first metal layer while the horizontal metal wires 20 are formed using a second metal layer. The first and second metal layers are typically higher-level metal layers instead of lower-level metal layers. As depicted in FIG. 1A, the first metal layer is metal layer 7 while the second metal layer is metal layer 6. In general, metal wires comprised of one or more other metal layers appropriately couple the vertical and horizontal metal wires 10 and 20 to cells and macrocells. Power or ground is commonly provided in an alternating manner to the vertical metal wires 10 and the horizontal metal wires 20. Furthermore, the width 50 of the metal wire 45 used for the vertical metal wires 10 and the horizontal metal wires 20 is typically uniform or constant, as shown in FIG. 1B.

SUMMARY OF THE INVENTION

Methods of creating a power distribution arrangement with tapered metal wires for a physical design are provided and described. In one embodiment, a method of creating a power distribution arrangement for a physical design of an integrated circuit includes arranging a plurality of metal wires for power distribution in a desired arrangement. Each metal wire has a width. Furthermore, the metal wires are tapered such that the width is thicker in a core edge area of the physical design than in a core center area of the physical design.

In another embodiment, a method of creating a power distribution arrangement for a physical design of a current integrated circuit includes arranging a plurality of metal wires for power distribution in a desired arrangement. The metal wires are tapered using a routing congestion profile of a prior physical design of a prior integrated circuit.

In yet another embodiment, a method of creating a power distribution arrangement for a physical design of a current integrated circuit including arranging a plurality of metal wires for power distribution in a desired arrangement. Moreover, the metal wires are tapered using a voltage drop profile of a prior physical design of a prior integrated circuit.

BRIEF DESCRIPTION OF THE DRAWINGS

The accompanying drawings, which are incorporated in and form a part of this specification, illustrate embodiments of the invention and, together with the description, serve to explain the principles of the present invention.

FIG. 4 illustrates an exemplary routing congestion profile in accordance with an embodiment of the present invention.

DETAILED DESCRIPTION OF THE INVENTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details.

Methods of creating a power distribution arrangement with tapered metal wires for a physical design are provided and described herein. The following description of the invention is applicable to physical designs for integrated circuit chips. Moreover, the invention can be practiced on the entire physical design. Additionally, the invention can be practiced on a portion of the physical design, and then this portion of the physical design can be integrated with the rest of the physical design.

Although the description of the invention will focus on hierarchical physical designs, it should be understood that the invention is applicable to other types of physical designs. Moreover, the description of the invention will focus on an abutted-pin hierarchical physical design. It should be understood that the invention is applicable to other types of hierarchical physical designs.

A detailed description of an abutted-pin hierarchical physical design can be found in the co-pending, commonly-owned U.S. patent application Ser. No. 09/714,722, filed on Nov. 15, 2000, entitled "OPTIMIZATION OF ABUTTED-PIN HIERARCHICAL PHYSICAL DESIGN", by Dahl et al., which is incorporated herein by reference.

As discussed above, the floorplanning stage of a hierarchical physical design affects subsequent physical design stages such as placement and routing. If the floorplanning stage takes into account the goals, objectives, and causes of problems associated with the placement and routing stages, a floorplan is generated which can facilitate, enhance, and optimize the placement and routing stages.

Figure 2A:
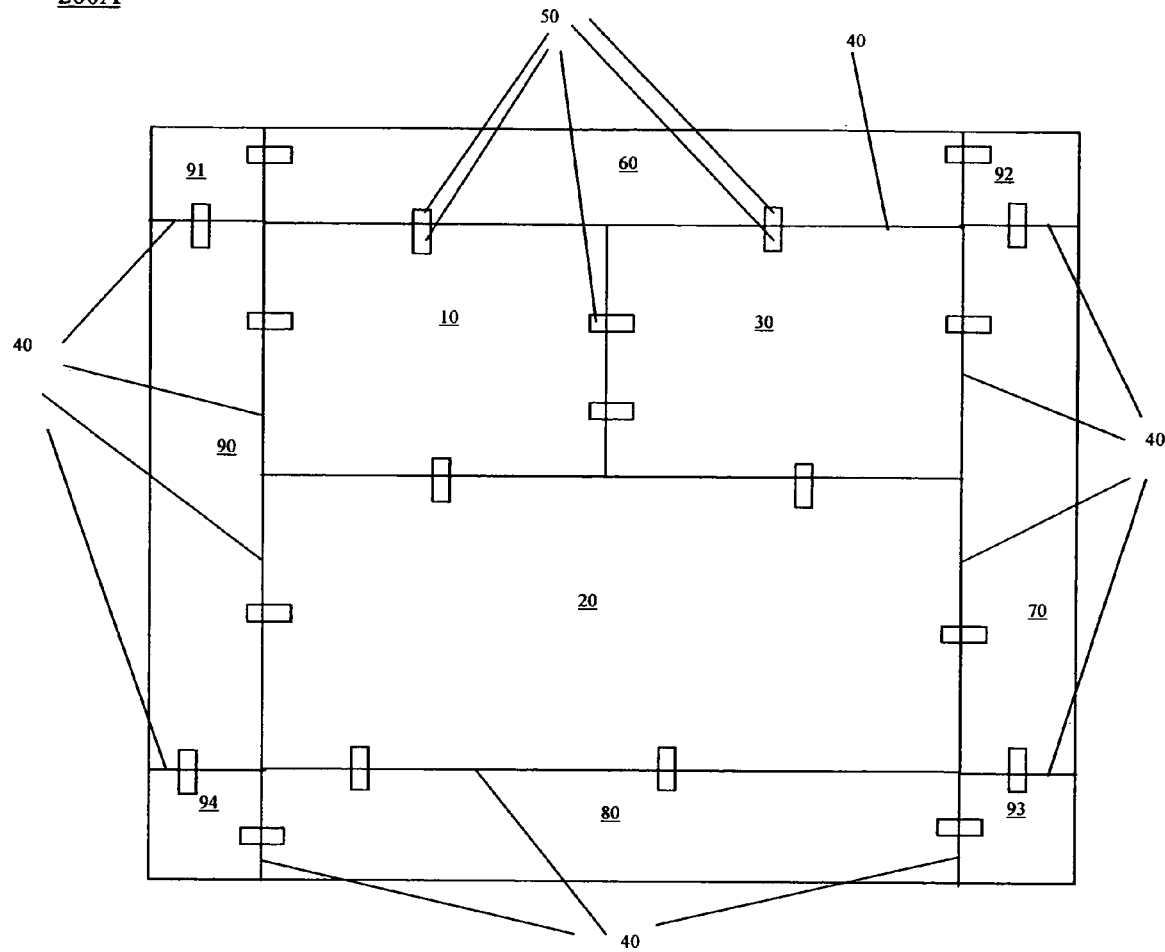
FIG. 2A illustrates a top-level floorplan of an abutted-pin hierarchical physical design in accordance with an embodiment of the present invention.

FIG. 2A illustrates a top-level floorplan 200A of an abutted-pin hierarchical physical design in accordance with an embodiment of the present invention. As depicted in FIG. 2A, the top-level floorplan 200A includes a plurality of blocks 10–30 and 60–94. The blocks 10–30 and 60–94 are partitions of the netlist, which is provided as an input to the floorplanning stage. These blocks 10–30 and 60–94 are also referred to as place-and-route blocks (pnr blocks). One distinguishing feature of the top-level floorplan 200A of an abutted-pin hierarchical physical design is the lack of routing channels between the blocks 10–30 and 60–94. Here, edges 40 of one block abut edges 40 of another block. Hence, the entire chip area and chip shape utilized in the top-level floorplan 200A is covered with blocks 10–30 and 60–94. Another distinguishing feature of the top-level floorplan 200A of an abutted-pin hierarchical physical design is the merging of traditional top-level components or objects (e.g., timing components, clock distribution wiring, power distribution wiring, repeaters, buffers, etc.) into the individual blocks 10–30 and 60–94 and corresponding block-level netlists.

Continuing with FIG. 2A, blocks 10–30 form a core area of the top-level floorplan 200A. These blocks 10–30 have cells and macrocells providing the primary digital and/or analog functionality of the integrated circuit chip fabricated using this top-level floorplan 200A. Blocks 60–94 form a padring area of the top-level floorplan 200A. These blocks 60–94 have bonding pad cells or bump cells and other support circuitry cells of the integrated circuit chip fabricated using this top-level floorplan 200A. Although the blocks 10–30 and 60–94 have rectangular shapes, it should be understood that the blocks 10–30 and 60–94 can have rectilinear shapes. Moreover, it should be understood that the top-level floorplan 200A can have more or less than the blocks depicted in FIG. 2A.

As described above, blocks 10–30 and 60–94 can have cells and macrocells. Each of these cells and macrocells has one or more ports (or terminals) for inputting signals or outputting signals, each of which, in turn, may connect to one or more ports of other cells and macrocells via metal wires. A net is a set of two or more ports that are connected.

Each block 10–30 and 60–94 has one or more pins 50. Each pin 50 of a block 10–30 and 60–94 represents a location where a signal enters the block or a location where a signal exits the block. The pins 50 are utilized in placing and routing each block during block-level operations. At the top-level of a hierarchical physical design (e.g., an abutted-pin hierarchical physical design), a router is used to route nets representing two or more ports of different blocks that are connected. A global route is created for each of these nets. In general, a location of a pin 50 is defined where the routing wire (or global route) crosses the boundary or edge 40 of the block. Since boundaries or edges 40 of one block 10–30 and 60–94 abut boundaries or edges 40 of another block 10–30 and 60–94, the pin 50 of one block 10–30 and 60–94 abuts the pin 50 of another block 10–30 and 60–94, as shown in the top-level floorplan 200A for an abutted-pin hierarchical physical design in FIG. 2A.

Figure 2B:
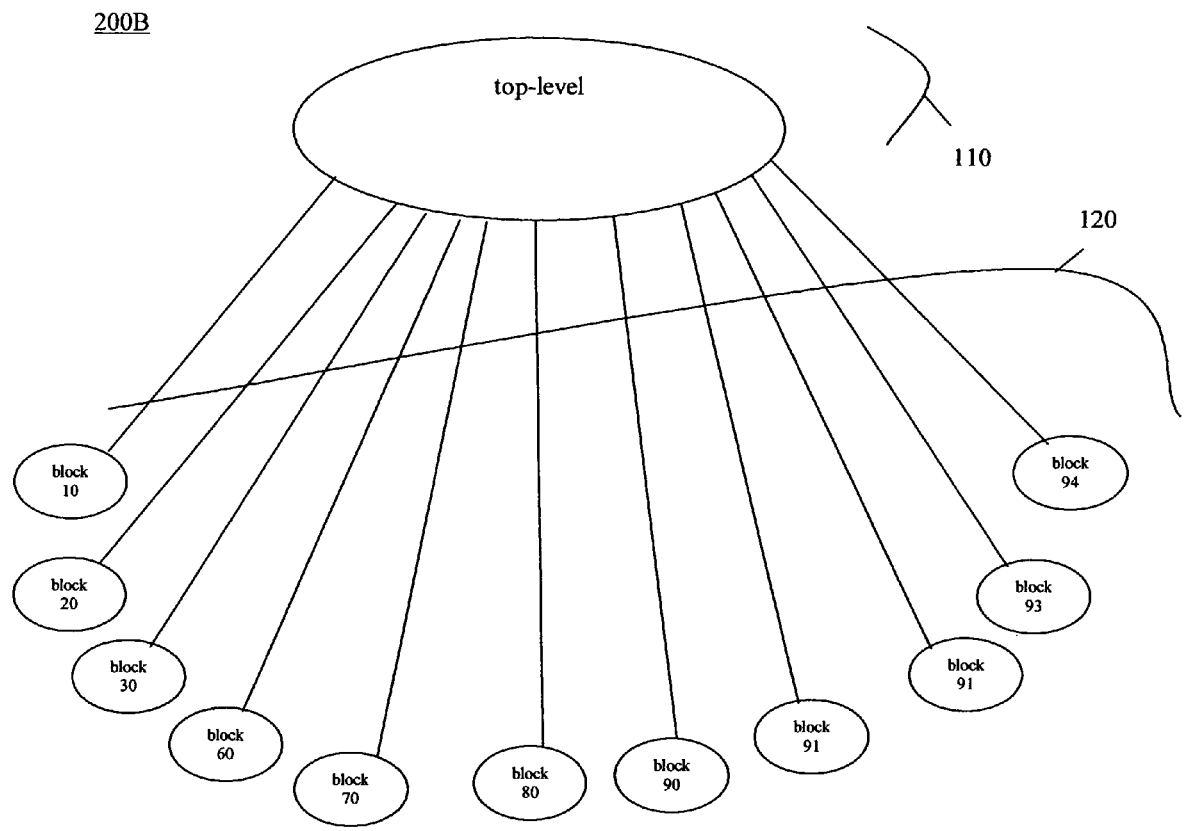
FIG. 2B illustrates the two-level hierarchy of the abutted-pin hierarchical physical design of FIG. 2A in accordance with an embodiment of the present invention.

FIG. 2B illustrates the two-level hierarchy 200B of the abutted-pin hierarchical physical design of FIG. 2A in accordance with an embodiment of the present invention. The two-level hierarchy 200B includes a top-level 110 and a block-level 120. The top-level 110 has the top-level floorplan 200A described with respect to FIG. 2A. Block-level 120 includes each block 10–30 and 60–94 of top-level floorplan 200A. The cells and macrocells of individual blocks 10–30 and 60–94 can be placed and routed in parallel, reducing physical design time and enabling higher magnitudes of optimization.

Methods of creating a power distribution arrangement with tapered metal wires for a physical design are provided and described herein. Typically, the power distribution arrangement is created during the floorplanning stage. A method of creating a power distribution arrangement for a physical design of an integrated circuit is shown in FIGS. 3A–3D in accordance with an embodiment of the present invention. The method includes arranging a plurality of metal wires for power distribution in a desired arrangement. Each metal wire has a width. Furthermore, the metal wires are tapered such that the width is thicker in a core edge area of the physical design than in a core center area of the physical design.

Figure 3A:
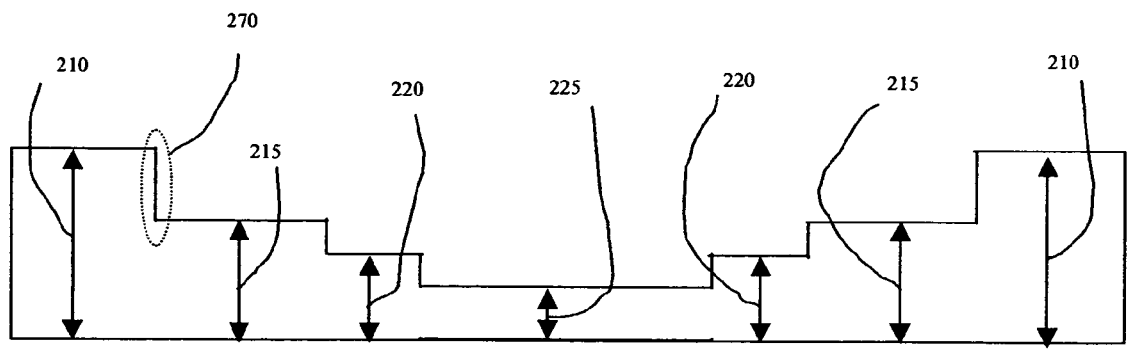
FIG. 3A illustrates a first tapered metal wire for a power distribution arrangement in accordance with an embodiment of the present invention.
Figure 3B:
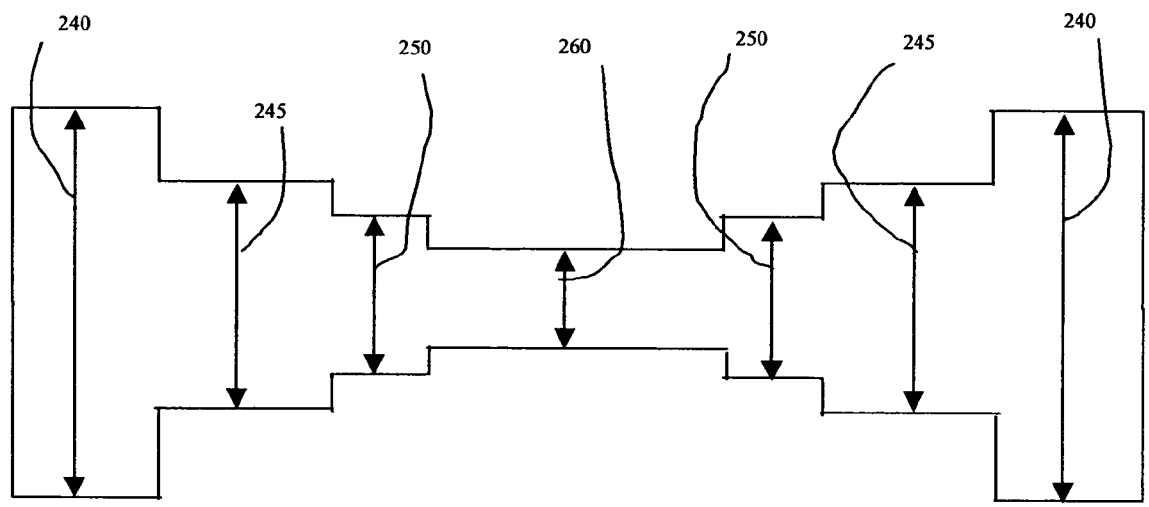
FIG. 3B illustrates a second tapered metal wire for a power distribution arrangement in accordance with an embodiment of the present invention.

Instead of using the metal wire 45 (FIG. 1B) having uniform or constant width to form the power distribution arrangement for a physical design (flat or hierarchical), the power distribution arrangement for a physical design (flat or hierarchical) is created with tapered metal wire. FIG. 3A illustrates a first tapered metal wire 300A for a power distribution arrangement in accordance with an embodiment of the present invention. FIG. 3B illustrates a second tapered metal wire 300B for a power distribution arrangement in accordance with an embodiment of the present invention.

Typically, the design specifications for an integrated circuit include a voltage requirement (e.g., 1.5 volts) and a maximum voltage drop (e.g., 5% or 50 millivolts). The voltage drop represents the voltage lost due to resistance between the location where the supplied voltage is inputted to the integrated circuit and the location where the cell or macrocell receives the supplied voltage. This voltage drop can be characterized by the equation $V=R\,I$, where V is the voltage drop, R is the resistance (e.g., of metal wires, of contacts, etc.), and I is the current (e.g., through metal wires, contacts, etc.). Generally, the current flowing through a power distribution arrangement has a greater magnitude near the core edge area of the physical design than near the core center area of the physical design. To counteract the increase in current, the resistance has to be decreased in order to minimize or reduce the voltage drop. This benefit is provided by the first and second tapered metal wires 300A (FIG. 3A) and 300B (FIG. 3B) of the present invention. Moreover, metal wires can be tapered in multiple metal layers to couple power and ground to cells and macrocells. Additionally, appropriate tapering of the metal wires can reduce the metal resources needed for the power distribution arrangement, increasing the metal resources available for the routing stage.

As shown in FIG. 3A, the first tapered metal wire 300A has multiple widths 210, 215, 220, and 225. Moreover, the first tapered metal wire 300A is symmetrically tapered from each end towards the center. The widths 210, 215, 220, and 225 gradually decrease, wherein each end is thicker than the rest of the metal wire 300A. Typically, a decrease 270 in the width of the first tapered metal wire 300A is sized to avoid dividing a routing track. Here, one side of the first tapered metal wire 300A is tapered while the opposite side is linear.

Referring to FIG. 3B, the second tapered metal wire 300B has multiple widths 240, 245, 250, and 260. Moreover, the second tapered metal wire 300B is symmetrically tapered from each end towards the center and is tapered on each side between each end. The widths 240, 245, 250, and 260 gradually decrease, wherein each end is thicker than the rest of the metal wire 300A. Typically, a decrease in the width of the second tapered metal wire 300B is sized to avoid dividing a routing track.

It should be understood that the tapered metal wire of the present invention can have over tapered shapes.

Figure 3C:
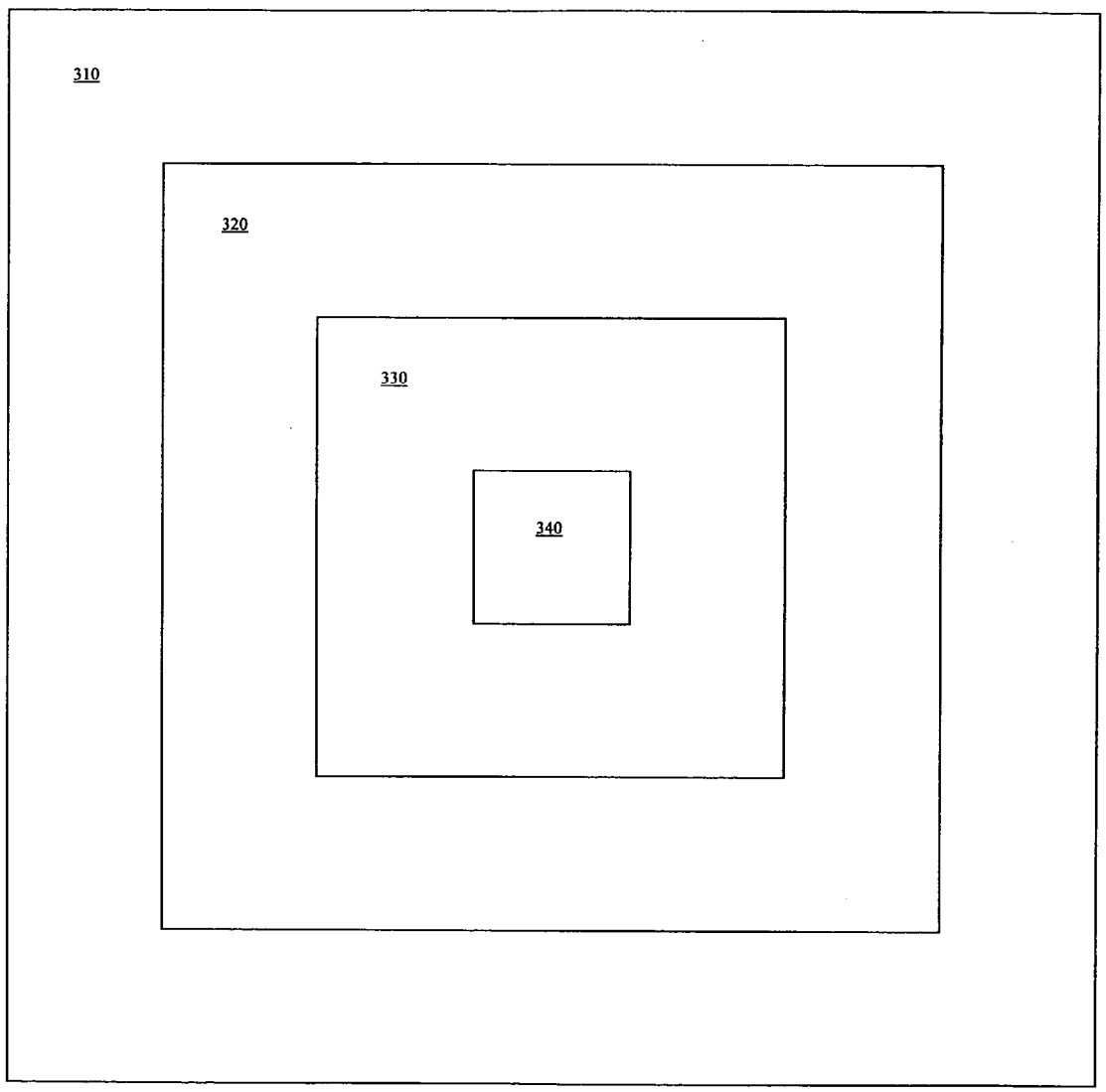
FIG. 3C illustrates a plurality of core zones of a physical design corresponding to the different widths of the first tapered metal wire of FIG. 3A and the second tapered metal wire of FIG. 3B in accordance with an embodiment of the present invention.

Furthermore, FIG. 3C illustrates a plurality of core zones 310–340 of a physical design 300C corresponding to the different widths of the first tapered metal wire 300A of FIG. 3A and the second tapered metal wire 300B of FIG. 3B in accordance with an embodiment of the present invention. As depicted in FIG. 3C, the core chip area of the physical design 300C is divided such that the width of the metal wire is optimized in each core zone 310–340 to minimize or reduce the voltage drop and to reduce the metal resources needed for the power distribution arrangement, increasing the metal resources available for the routing stage. In general, the width of the tapered metal wire is thicker in core zone 310 than in core zones 320–340. Continuing, the width of the tapered metal wire is thinner in core zone 340 than in core zones 310–330. In an embodiment, the widths 210 and 240 (of FIGS. 3A–3B) correspond to the core zone 310, the widths 215 and 245 (of FIGS. 3A–3B) correspond to the core zone 320, the widths 220 and 250 (of FIGS. 3A–3B) correspond to the core zone 330, and the widths 210 and 240 (of FIGS. 3A–3B) correspond to the core zone 340.

Figure 3D:
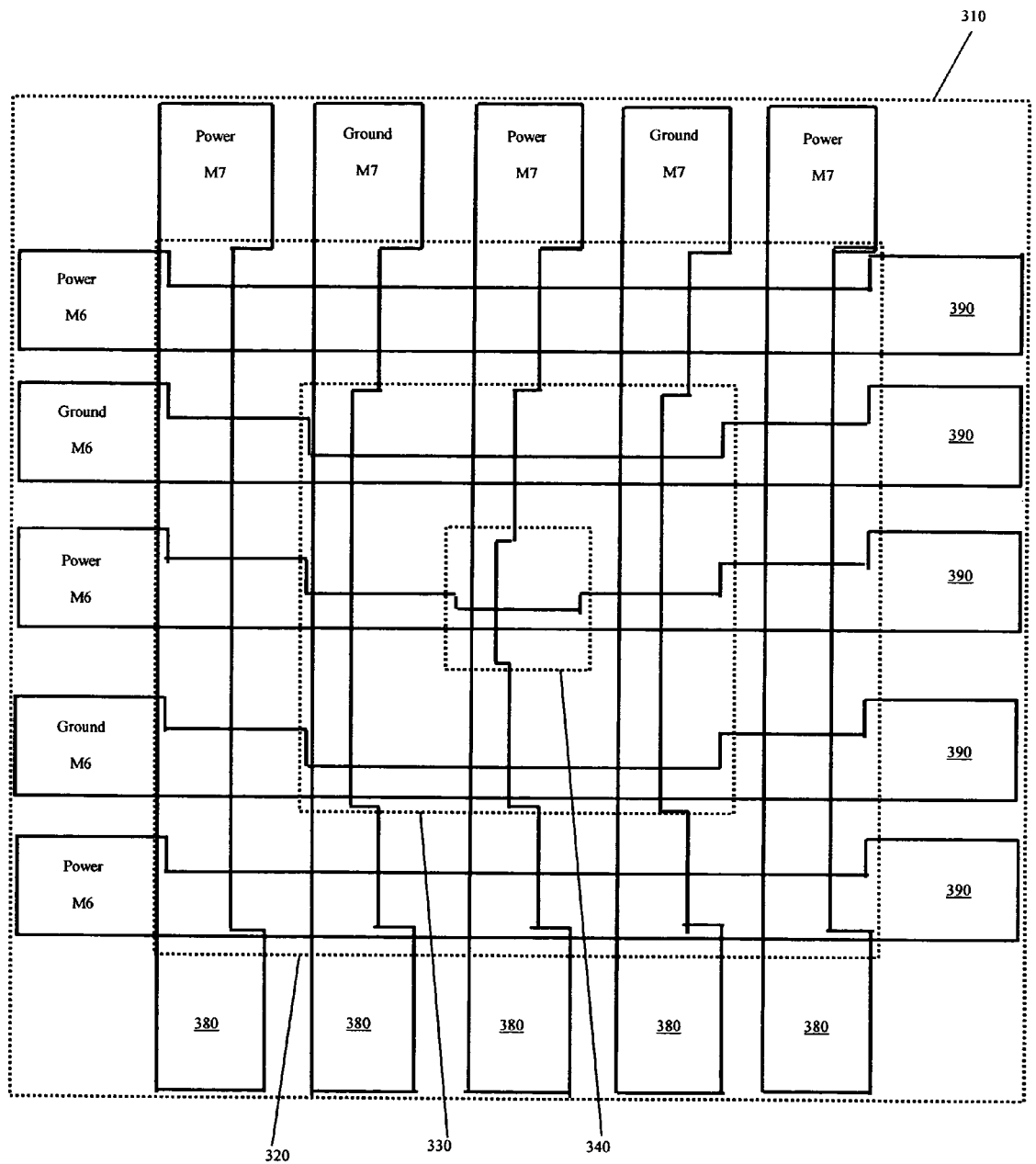
FIG. 3D illustrates a first exemplary power distribution arrangement for a physical design using the tapered metal wire of FIG. 3A in accordance with an embodiment of the present invention.

FIG. 3D illustrates a first exemplary power distribution arrangement 300D for a physical design using the tapered metal wire 300A of FIG. 3A in accordance with an embodiment of the present invention. The first exemplary power distribution arrangement 300D has a plurality of tapered metal wires 380 and 390 arranged in a mesh shape. Moreover, the vertical tapered metal wires 380 are formed using a first metal layer while the horizontal tapered metal wires 390 are formed using a second metal layer. As depicted in FIG. 3D, the first metal layer is metal layer 7 while the second metal layer is metal layer 6. Power or ground is provided in an alternating manner to the vertical tapered metal wires 380 and the horizontal tapered metal wires 390. Moreover, the core zones 310–340 are shown in FIG. 3D. It should be understood that the power distribution arrangement 300D can be implemented in other ways with tapered metal wires and with other shapes for the tapered metal wires. In an embodiment, metal wires (typically wider than those shown in FIG. 1A) are arranged in the desired power distribution arrangement. Then, these metal wires are tapered to create the power distribution arrangement 300D.

Methods of creating a power distribution arrangement for a physical design of a current integrated circuit are shown in FIGS. 4–6B in accordance with an embodiment of the present invention. A method includes arranging a plurality of metal wires for power distribution in a desired arrangement. The metal wires are tapered using a routing congestion profile of a prior physical design of a prior integrated circuit. In another embodiment, the metal wires are tapered using a voltage drop profile of a prior physical design of a prior integrated circuit.

Since the prior physical design of the prior integrated circuit has been optimized at the top-level and block-level to conform to design specifications, the physical design information of the prior physical design provides useful data to optimize the physical design of the current integrated circuit. In particular, the physical design information enables determination of the extent that the metal wire should be tapered.

Moreover, the widths of individual tapered metal wires can be adjusted (e.g., by increasing the width or decreasing the width) based on the physical design information of the prior physical design to avoid problems (e.g., routing congestion, excess voltage drop, etc.) encountered with the prior physical design. This physical design information can be retrieved from a database where it is stored. Ideally, the prior integrated circuit is an earlier version of the current integrated circuit, but is not required to be an earlier version of the current integrated circuit.

In an embodiment, the physical design information includes a routing congestion profile of the prior physical design. Moreover, the physical design information includes a voltage drop profile of the prior physical design. FIG. 4 illustrates an exemplary routing congestion profile 400 in accordance with an embodiment of the present invention. Here, the exemplary routing congestion profile 400 divides the chip area of the physical design into a grid, wherein each section of the grid provides a number representing the percentage of routing resources utilized in that section of the chip area. Routing congestion areas are characterized by high numbers in the exemplary routing congestion profile 400. Numbers such as 80, 90, and 95 are associated with routing congestion areas. It should be understood that a routing congestion profile can be implemented in other ways, such as a color-coded map of the chip area.

Figure 5:
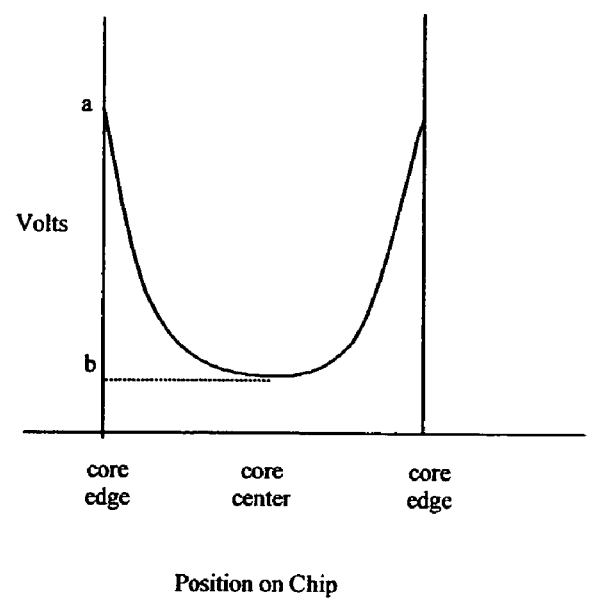
FIG. 5 illustrates an exemplary voltage drop profile in accordance with an embodiment of the present invention.

FIG. 5 illustrates an exemplary voltage drop profile 500 in accordance with an embodiment of the present invention. Here, the exemplary voltage drop profile 500 shows that the maximum voltage drop (which is a–b) occurs at the core center. As depicted in FIG. 5, the voltage drop increases at positions near the core center and decreases near the core edges. It should be understood that a voltage drop profile can be different than that shown in FIG. 5.

Figure 6A:
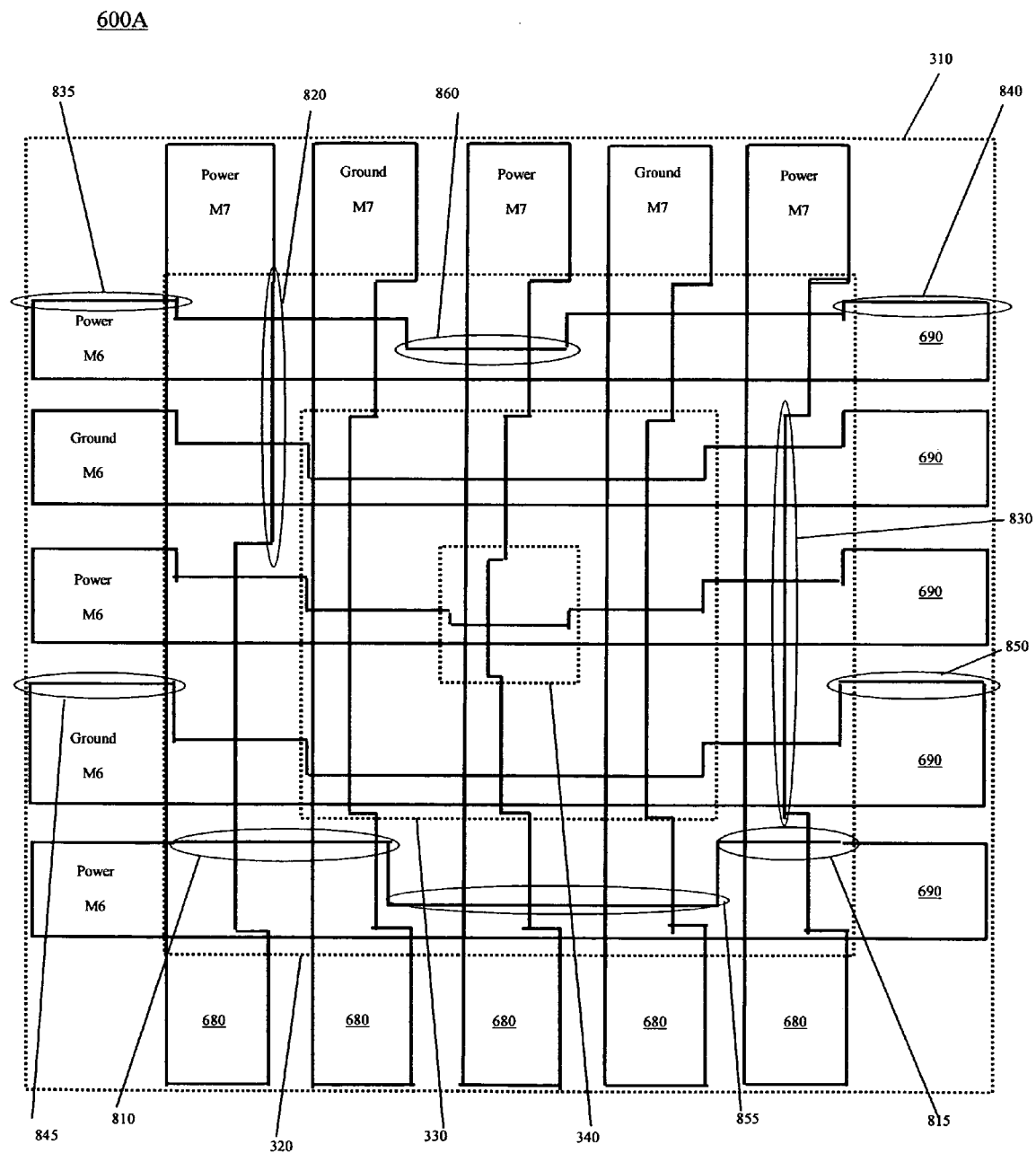
FIG. 6A illustrates a second exemplary power distribution arrangement for a physical design in accordance with an embodiment of the present invention.
Figure 6B:
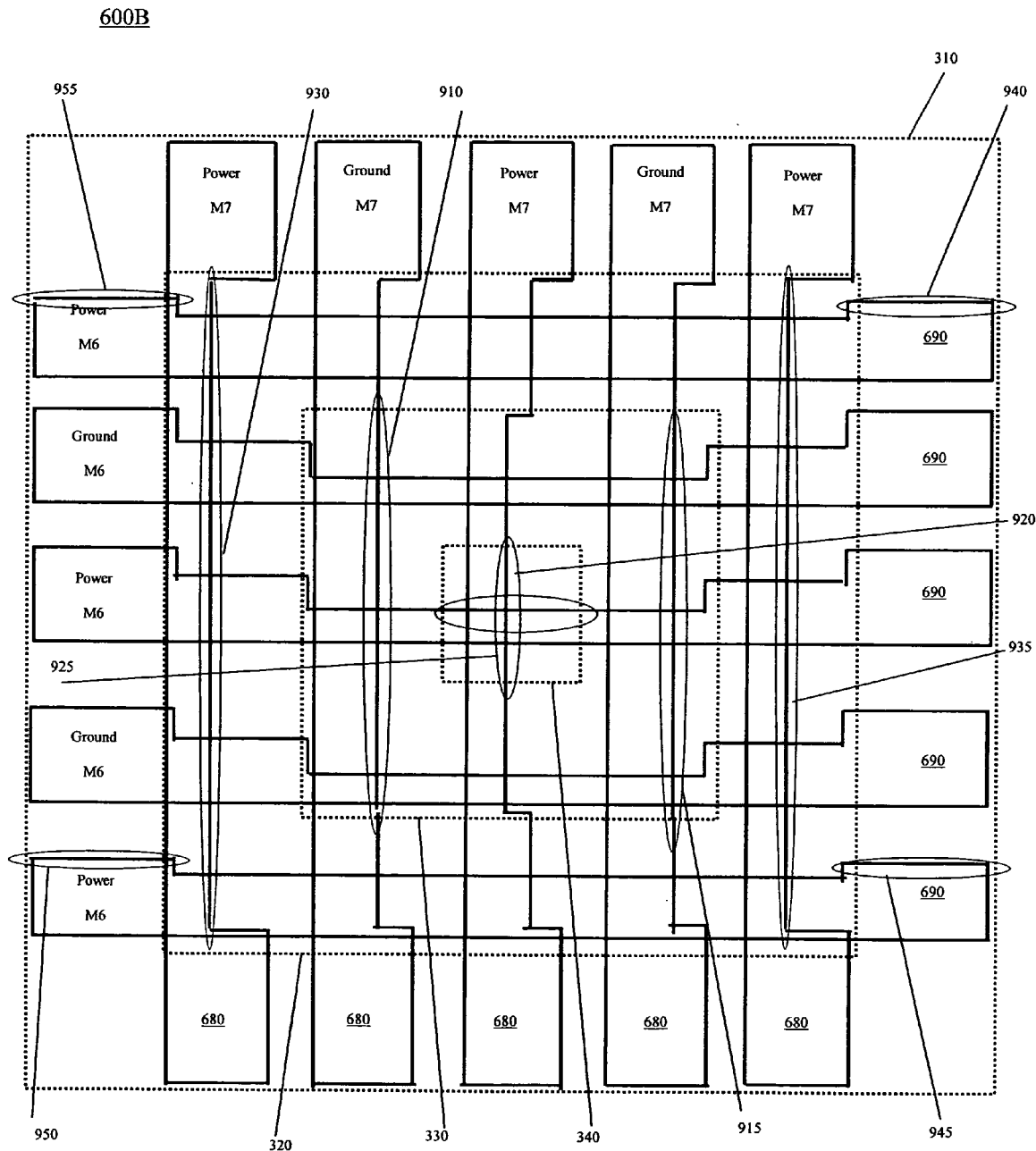
FIG. 6B illustrates a third exemplary power distribution arrangement for a physical design in accordance with an embodiment of the present invention.

Referring to FIG. 6A, a second exemplary power distribution arrangement 600A for a physical design is illustrated in accordance with an embodiment of the present invention. Moreover, FIG. 6B illustrates a third exemplary power distribution arrangement 600B for a physical design in accordance with an embodiment of the present invention. In an embodiment, the second exemplary power distribution arrangement 600A and the third exemplary power distribution arrangement 600B were created by tapering the metal wires of the first exemplary power distribution arrangement 300D using a routing congestion profile of the prior physical design, a voltage drop profile of the prior physical design, both profiles, or either one of these profiles.

In another embodiment, the second exemplary power distribution arrangement 600A and the third exemplary power distribution arrangement 600B were created by tapering the metal wires of the first exemplary power distribution arrangement 300D using a routing congestion profile of the current physical design, a voltage drop profile of the current physical design, both profiles, or either one of these profiles. Although these profiles of the current physical design are preliminary and incomplete, they can still provide useful data.

In yet another embodiment, the second exemplary power distribution arrangement 600A and the third exemplary power distribution arrangement 600B were created by tapering the metal wires of the first exemplary power distribution arrangement 300D using a routing congestion profile of the prior physical design, a voltage drop profile of the prior physical design, both profiles, either one of these profiles, or any profile of the current physical design.

Figure 1A:
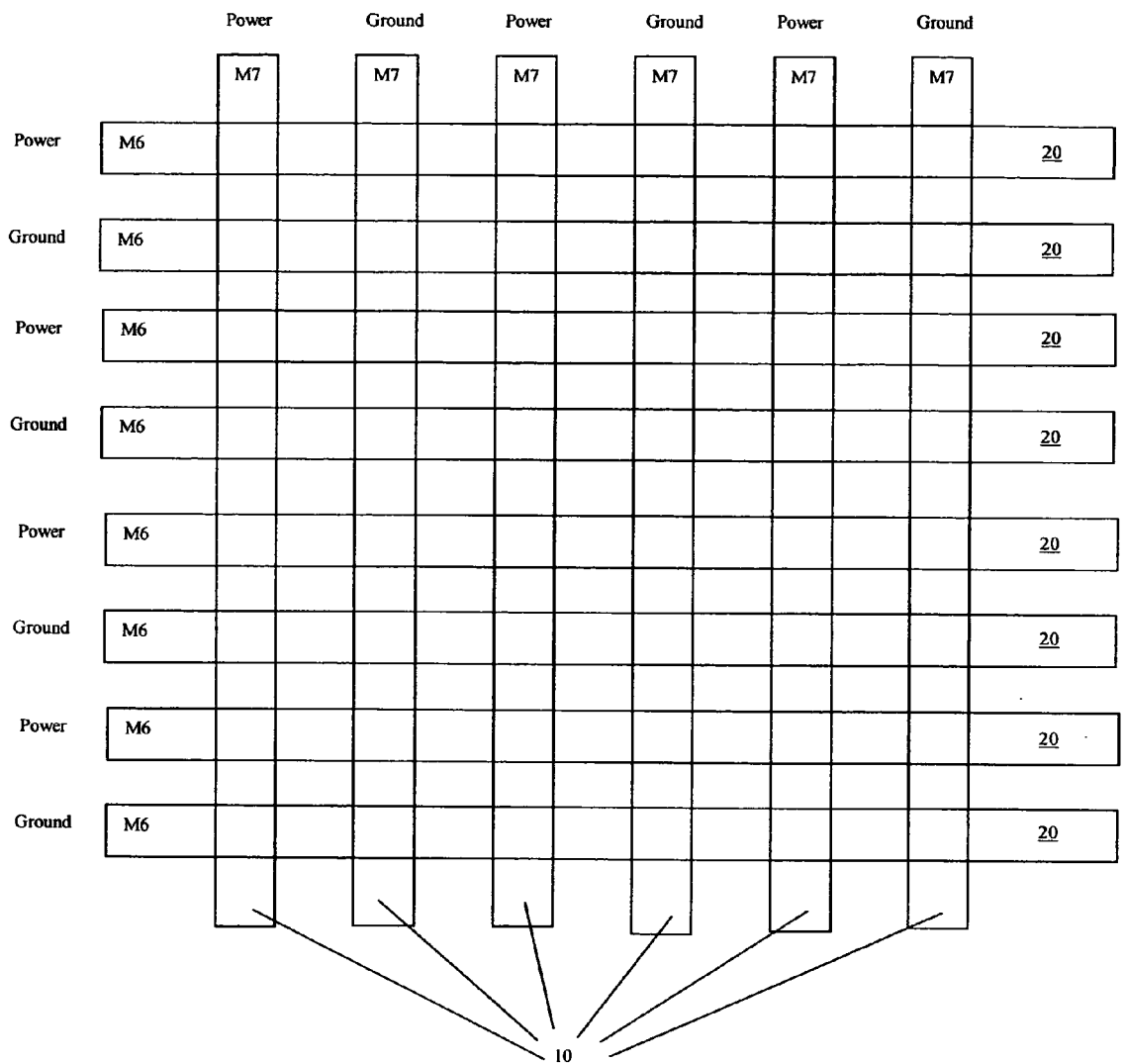
FIG. 1A illustrates a power distribution arrangement for a physical design (flat or hierarchical) of the prior art.
Figure 1B:
FIG. 1B illustrates the width of the metal wire used for the vertical metal wires and the horizontal metal wires of FIG. 1A is uniform or constant.

It should be understood that the power distribution arrangement 100 of FIG. 1A can be established and then the metal wires can be tapered using the physical design information of the prior physical design and/or the current physical design.

As shown in FIG. 6A, in areas 830, 835, 840, 855, and 860 the width of the tapered metal wire was decreased relative to the width depicted in FIG. 3D. Moreover, in areas 810, 815, 820, 845, and 850 the width of the tapered metal wire was increased relative to the width depicted in FIG. 3D.

Similarly, as illustrated in FIG. 6B, in areas, 930, 940, 945, 950, and 955 the width of the tapered metal was decreased relative to the width depicted in FIG. 3D. Moreover, in areas 910, 915, 920, 925, and 935 the width of the tapered metal wire was increased relative to the width depicted in FIG. 3D.

The tapered metal wires provide several benefits. The voltage drop is minimized or reduced. Amount of metal resources used for the power distribution arrangement is reduced, increasing the metal resources available for the routing stage. Moreover, AC yield can be increased, where AC yield represents fabricated chips that meet the logic design specifications as well as the performance design specifications (e.g., clock speed). Additionally, there is less need for an area fill operation to provide a uniform distribution of metal on the chip area, since this metal can be used for the power distribution arrangement.

In an embodiment, methods of the present invention are performed by computer-executable instructions stored in a computer-readable medium, such as a magnetic disk, CD-ROM, an optical medium, a floppy disk, a flexible disk, a hard disk, a magnetic tape, a RAM, a ROM, a PROM, an EPROM, a flash-EPROM, or any other medium from which a computer can read.

Figure 7:
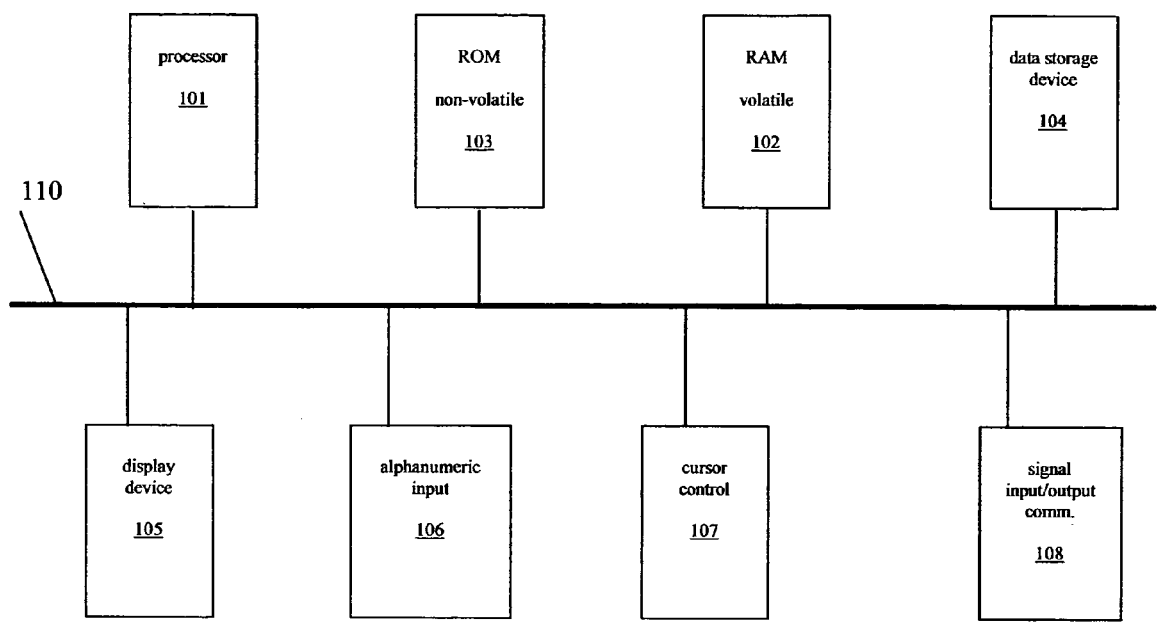
FIG. 7 illustrates an exemplary computer system on which embodiments of the present invention may be practiced.

FIG. 7 illustrates an exemplary computer system 700 on which embodiments of the present invention may be practiced. Aspects of the present invention can be implemented or executed on a computer system or any other computational system. Although a variety of different computer systems can be used with the present invention, an exemplary computer system 700 is shown in FIG. 7.

With reference to FIG. 7, portions of the present invention are comprised of computer-readable and computer executable instructions which reside, for example, in computer-usable media of an electronic system such as the exemplary computer system 700. FIG. 7 illustrates an exemplary computer system 700 on which embodiments of the present invention may be practiced. It is appreciated that the computer system 700 of FIG. 7 is exemplary only and that the present invention can operate within a number of different computer systems including general-purpose computer systems and embedded computer systems.

Computer system 700 includes an address/data bus 110 for communicating information, a central processor 101 coupled with bus 110 for processing information and instructions, a volatile memory 102 (e.g., random access memory RAM) coupled with the bus 110 for storing information and instructions for the central processor 101 and a non-volatile memory 103 (e.g., read only memory ROM) coupled with the bus 110 for storing static information and instructions for the processor 101. Exemplary computer system 700 also includes a data storage device 104 ("disk subsystem") such as a magnetic or optical disk and disk drive coupled with the bus 110 for storing information and instructions. Data storage device 104 can include one or more removable magnetic or optical storage media (e.g., diskettes, tapes) which are computer-readable memories.

Memory units of computer system 700 include volatile memory 102, non-volatile memory 103 and data storage device 104.

Exemplary computer system 700 can further include a signal Input/Output communication device 108 (e.g., a network interface card "NIC") coupled to the bus 110 for interfacing with other computer systems. Also included in exemplary computer system 700 of FIG. 7 is an alphanumeric input device 106 including alphanumeric and function keys coupled to the bus 110 for communicating information and command selections to the central processor 101. Exemplary computer system 700 also includes a cursor control or directing device 107 coupled to the bus 110 for communicating user input information and command selections to the central processor 101. A display device 105 can also be coupled to the bus 110 for displaying information to the computer user. Display device 105 may be a liquid crystal device, other flat panel display, cathode ray tube, or other display device suitable for creating graphic images and alphanumeric characters recognizable to the user. Cursor control device 107 allows the user to dynamically signal the two-dimensional movement of a visible symbol (cursor) on a display screen of display device 105. Many implementations of cursor control device 107 are known in the art including a trackball, mouse, touch pad, joystick or special keys on alphanumeric input device 106 capable of signaling movement of a given direction or manner of displacement. Alternatively, it will be appreciated that a cursor can be directed and/or activated via input from alphanumeric input device 106 using special keys and key sequence commands.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of creating a power distribution arrangement for a physical design of an integrated circuit, said method comprising:
   arranging a plurality of metal wires for power distribution in a desired arrangement, each metal wire having a width; and
   tapering said metal wires such that said width is thicker in a core edge area of said physical design than in a core center area of said physical design, the tapering of the width based at least in part on a routing congestion profile.

2. The method as recited in claim 1 wherein said physical design is a hierarchical physical design.

3. The method as recited in claim 2 wherein said hierarchical physical design has a top-level and a block-level.

4. The method as recited in claim 2 wherein said hierarchical physical design is an abutted-pin hierarchical physical design.

5. The method as recited in claim 1 wherein said desired arrangement has a mesh shape.

6. The method as recited in claim 1, wherein the routing congestion profile comprises one of a prior routing congestion profile and a current routing congestion profile.

7. The method as recited in claim 1, wherein the tapering of the width is further based on a voltage drop profile comprising one of a prior voltage drop profile and a current voltage drop profile.

8. A computer-readable medium comprising computer-executable instructions stored therein for performing a method of creating a power distribution arrangement for a physical design of an integrated circuit, said method comprising:
   arranging a plurality of metal wires for power distribution in a desired arrangement, each metal wire having a width; and
   tapering said metal wires such that said width is thicker in a core edge area of said physical design than in a core center area of said physical design, the tapering of said width based at least in part on a routing congestion profile.

9. The computer-readable medium as recited in claim 8 wherein said physical design is a hierarchical physical design.

10. The computer-readable medium as recited in claim 9 wherein said hierarchical physical design has a top-level and a block-level.

11. The computer-readable medium as recited in claim 9 wherein said hierarchical physical design is an abutted-pin hierarchical physical design.

12. The computer-readable medium as recited in claim 8 wherein said desired arrangement has a mesh shape.

13. The computer-readable medium as recited in claim 8 wherein said a routing congestion profile comprises one of a prior routing congestion profile and a current routing congestion profile.

14. The computer-readable medium as recited in claim 8 wherein the tapering of width is further based on a voltage drop profile comprising one of a prior voltage drop profile and a current voltage drop profile.

15. A computer system comprising:
   a processor coupled to a bus; and
   a memory device couples to said bus, wherein said memory device includes computer-executable instructions stored therein for performing a method of creating a power distribution arrangement for a physical design of an integrated circuit, said method comprising:
   arranging a plurality of metal wires for power distribution in a desired arrangement, each metal wire having a width; and
   metal wires such that said width is thicker in a core edge area of said physical design than in a core center area of said physical design, the tapering of said width based at least in part on a routing congestion profile.

16. The computer system as recited in claim 15 wherein said physical design is a hierarchical physical design.

17. The computer system as recited in claim 16 wherein said hierarchical physical design has a top-level and a block-level.

18. The computer system as recited in claim 16 wherein said hierarchical physical design is an abutted-pin hierarchical physical design.

19. The computer system as recited in claim 15 wherein said desired arrangement has a mesh shape.

20. The computer system as recited in claim 15 wherein said routing congestion profile comprises one of a prior routing congestion profile and a current routing congestion profile.

21. The computer system as recited in claim 15 wherein the tapering of width is further based on a voltage drop profile comprising one of a prior voltage drop profile and a current voltage drop profile.

22. A method of creating a power distribution arrangement for a physical design of a current integrated circuit, said method comprising:
arranging a plurality of metal wires for power distribution in a desired arrangement; and
tapering said metal wires using a routing congestion profile of a prior physical design of a prior integrated circuit.

23. The method as recited in claim 22 wherein said physical design is a hierarchical physical design.

24. The method as recited in claim 23 wherein said hierarchical physical design has a top-level and a block-level.

25. The method as recited in claim 23 wherein said hierarchical physical design is an abutted-pin hierarchical physical design.

26. The method as recited in claim 22 wherein said desired arrangement has a mesh shape.

27. The method as recited in claim 22 further comprising tapering said metal wires using a voltage drop profile of said prior physical design of said prior integrated circuit.

28. A computer-readable medium comprising computer-executable instructions stored therein for performing a method of creating a power distribution arrangement for a physical design of a current integrated circuit, said method comprising:
arranging a plurality of metal wires for power distribution in a desired arrangement; and
tapering said metal wires using a routing congestion profile of a prior physical design of a prior integrated circuit.

29. The computer-readable medium as recited in claim 28 wherein said physical design is a hierarchical physical design.

30. The computer-readable medium as recited in claim 29 wherein said hierarchical physical design has a top-level and a block-level.

31. The computer-readable medium as recited in claim 29 wherein said hierarchical physical design is an abutted-pin hierarchical physical design.

32. The computer-readable medium as recited in claim 28 wherein said desired arrangement has a mesh shape.

33. The computer-readable medium as recited in claim 28 wherein said method further comprises tapering said metal wires using a voltage drop profile of said prior physical design of said prior integrated circuit.

34. A computer system comprising:
a processor coupled to a bus; and
a memory device couples to said bus, wherein said memory device includes computer-executable instructions stored therein for performing a method of creating a power distribution arrangement for a physical design of a current integrated circuit, said method comprising:
arranging a plurality of metal wires for power distribution in a desired arrangement; and
tapering said metal wires using a routing congestion profile of a prior physical design of a prior integrated circuit.

35. The computer system as recited in claim 34 wherein said physical design is a hierarchical physical design.

36. The computer system as recited in claim 35 wherein said hierarchical physical design has a top-level and a block-level.

37. The computer system as recited in claim 35 wherein said hierarchical physical design is an abutted-pin hierarchical physical design.

38. The computer system as recited in claim 34 wherein said desired arrangement has a mesh shape.

39. The computer system as recited in claim 34 wherein said method further comprises tapering said metal wires using a voltage drop profile of said prior physical design of said prior integrated circuit.

40. A method of creating a power distribution arrangement for a physical design of a current integrated circuit, said method comprising:
arranging a plurality of metal wires for power distribution in a desired arrangement; and
tapering said metal wires using a voltage drop profile of a prior physical design of a prior integrated circuit.

41. The method as recited in claim 40 wherein said physical design is a hierarchical physical design.

42. The method as recited in claim 41 wherein said hierarchical physical design has a top-level and a block-level.

43. The method as recited in claim 41 wherein said hierarchical physical design is an abutted-pin hierarchical physical design.

44. The method as recited in claim 40 wherein said desired arrangement has a mesh shape.

45. The method as recited in claim 40 further comprising tapering said metal wires using a routing congestion profile of said prior physical design of said prior integrated circuit.

46. A computer-readable medium comprising computer-executable instructions stored therein for performing a method of creating a power distribution arrangement for a physical design of a current integrated circuit, said method comprising:
arranging a plurality of metal wires for power distribution in a desired arrangement; and
tapering said metal wires using a voltage drop profile of a prior physical design of a prior integrated circuit.

47. The computer-readable medium as recited in claim 46 wherein said physical design is a hierarchical physical design.

48. The computer-readable medium as recited in claim 47 wherein said hierarchical physical design has a top-level and a block-level.

49. The computer-readable medium as recited in claim 47 wherein said hierarchical physical design is an abutted-pin hierarchical physical design.

50. The computer-readable medium as recited in claim 46 wherein said desired arrangement has a mesh shape.

51. The computer-readable medium as recited in claim 46 wherein said method further comprises tapering said metal wires using a routing congestion profile of said prior physical design of said prior integrated circuit.

52. A computer system comprising:
a processor coupled to a bus; and
a memory device couples to said bus, wherein said memory device includes computer-executable instructions stored therein for performing a method of creating a power distribution arrangement for a physical design of a current integrated circuit, said method comprising:
arranging a plurality of metal wires for power distribution in a desired arrangement; and
tapering said metal wires using a voltage drop profile of a prior physical design of a prior integrated circuit.

53. The computer system as recited in claim 52 wherein said physical design is a hierarchical physical design.

54. The computer system as recited in claim 53 wherein said hierarchical physical design has a top-level and a block-level.

55. The computer system as recited in claim 53 wherein said hierarchical physical design is an abutted-pin hierarchical physical design.

56. The computer system as recited in claim 52 wherein said desired arrangement has a mesh shape.

57. The computer system as recited in claim 52 wherein said method further comprises tapering said metal wires using a routing congestion profile of said prior physical design of said prior integrated circuit.

* * * * *